(12) United States Patent
Faris

(10) Patent No.: US 7,388,767 B2
(45) Date of Patent: Jun. 17, 2008

(54) ELECTROCHEMICAL LITHOGRAPHY MEMORY SYSTEM AND METHOD

(75) Inventor: Sadeg M. Faris, Pleasantville, NY (US)

(73) Assignee: Reveo, Inc., Hawthorne, NY (US)

( * ) Notice: Subject to any disclaimer, the term of this patent is extended or adjusted under 35 U.S.C. 154(b) by 400 days.

(21) Appl. No.: 11/180,897

(22) Filed: Jul. 13, 2005

(65) Prior Publication Data

US 2006/0072360 A1  Apr. 6, 2006

Related U.S. Application Data

(63) Continuation-in-part of application No. 11/077,542, filed on Mar. 10, 2005.

(60) Provisional application No. 60/587,606, filed on Jul. 13, 2004.

(51) Int. Cl.
    *G11C 19/08* (2006.01)

(52) U.S. Cl. ..................... 365/1; 365/185.21

(58) Field of Classification Search ................ 365/1, 365/185.21
    See application file for complete search history.

(56) References Cited

U.S. PATENT DOCUMENTS

| 6,671,197 B2 * | 12/2003 | Athanassiadis | ............. 365/49 |
| 2007/0041231 A1 * | 2/2007 | Ferren et al. | .................. 365/1 |

* cited by examiner

*Primary Examiner*—Pho M. Luu

(57) ABSTRACT

Electronic memory devices fabricated using nanolithography techniques enables rapid and reliable storage of data on a substrate. One such device includes a memory access head, which includes a conductive member and an insulative member. The conductive member includes a proximal conductive tip, a distal conductive tip, and a body portion. The body portion is embedded in the insulative member. The device further includes a substrate adjacent to the distal conductive tip, an electrolyte disposed between the distal conductive tip and the substrate; and a microchip in communication with the proximal conductive tip.

18 Claims, 7 Drawing Sheets

ELECTROCHEMICAL LITHOGRAPHY MEMORY SYSTEM AND METHOD

RELATED APPLICATIONS

This application claims the benefit under 35 U.S.C. § 119(e) of U.S. Provisional Application No. 60/587,606 filed on Jul. 13, 2004, which is herein incorporated by reference. This application is a continuation-in-part of and claims the benefit under 35 U.S.C. § 120 of copending U.S. patent application Ser. No. 11/077,542 filed on Mar. 10, 2005 entitled "Nanolithography and Microlithography Devices and Method of Manufacturing Such Devices" which is herein incorporated by reference.

TECHNICAL FIELD

The invention relates generally to electronic memory including electrochemical lithography memory systems and methods, and more particularly to nanolithography memory systems and methods.

BACKGROUND INFORMATION

A dynamic random access memory (DRAM) cell typically includes a charge storage capacitor (or cell capacitor) coupled to an access device such as a Metal-Oxide-Semiconductor Field Effect Transistor (MOSFET). The MOSFET charges or discharges the capacitor, thereby affecting a logical state defined by the stored charge. The operating conditions of DRAM, such as operating voltage, leakage rate, and refresh rate, typically require that a certain minimum charge be stored by the capacitor. In order to increase memory capacity, the packing density of storage cells must increase, however, each storage cell capacitor must maintain a required capacitance level for a respective memory cell area. Accordingly, it is becoming extremely difficult to produce a capacitor with a relatively high storage capacitance that will also fit within the available memory cell area.

Another category of miniature electronic devices includes single-electron components. With these devices, switching processes are executed with single electrons. These devices involve techniques for memory systems in silicon technology based on trapping of single electrons on silicon inclusions in the gate oxide of transistors and trapping of electrons at traps or point defects in the gate oxide. Additional techniques include trapping of electrons on the grains of polysilicon in thin film transistors and trapping of single electrons in potential minimum regions in an ultra-thin film of roughened silicon on insulator material. Most of these techniques, however, involve the tunneling of electrons through thin oxides, which in turn requires high electric fields in such oxides. Such high electric fields degrade the oxides and confer only a limited number of memory cycling times, typically on the order of $10^9$ times. Other single-electron techniques involve the trapping of electrons on polysilicon grains formed in thin film devices. This process, however, is difficult to control since the roughening of the polysilicon to form the grains occurs randomly.

SUMMARY OF THE INVENTION

The invention relates generally to electronic memory, and more particularly to memory systems and methods that involve nanolithography techniques. In one embodiment, the electronic memory of the present invention enables rapid and reliable storage of data densely packed on a substrate.

In one aspect, the invention relates to a memory device. The memory device includes a memory access head, which includes a conductive member and an insulative member. The conductive member includes a proximal conductive tip, a distal conductive tip, and a body portion. The body portion is embedded in the insulative member. The memory device further includes a substrate adjacent to the distal conductive tip, an electrolyte disposed between the distal conductive tip and the substrate, and a microchip in communication with the proximal conductive tip.

In one embodiment, the memory device includes a voltage source that is in communication with the substrate and the microchip. In another embodiment, the memory device includes a voltage-measuring device that is in communication with the substrate and the proximal conductive tip. In still another embodiment, the memory device includes a voltage controller that is in communication with the voltage source. In other embodiments, the conductive member is an anode and the substrate is a cathode. In still other embodiments, the conductive member is a cathode and the substrate is an anode. In other embodiments, the memory device includes a position controller in communication with the memory access head. In yet another embodiment, the microchip includes at least one switch in communication with the proximal conductive tip In another aspect the invention relates to a memory device. The memory device includes an array of memory access heads. Each memory access head includes a conductive member and an insulative member. The conductive member includes a proximal conductive tip, a distal conductive tip, and a body portion. The body portion is embedded in the insulative member. The memory device further includes a substrate that is adjacent to each of the distal conductive tips. The memory device further includes an electrolyte disposed between the array of memory access heads and the substrate, and a microchip in communication with each of the proximal conductive tips.

In one embodiment, memory device includes a voltage source in communication with the substrate and the microchip. In another embodiment, the memory device includes a voltage-measuring device in communication with the substrate and each of the proximal conductive tips. In still another embodiment, the memory device includes a voltage controller in communication with the voltage source. In other embodiments, each of the conductive members is an anode and the substrate is a cathode. In still other embodiments, each of the conductive members is a cathode and the substrate is an anode. In yet another embodiment, the microchip includes a plurality of switches where each of the plurality of switches is in communication with one of the proximal conductive tips.

In yet another aspect, the invention relates to a method of writing data to a memory. The method includes providing a memory device. The memory device includes a memory access head. The memory access head includes a conductive member and an insulative member. The conductive member includes a proximal conductive tip, a distal conductive tip, and a body portion. The body portion is embedded in the insulative member. The memory device further includes a substrate adjacent to the distal conductive tip, and an electrolyte disposed between the distal conductive tip and the substrate. The method further includes applying a voltage to the substrate and the proximal conductive tip, which causes ionic transfer between the distal conductive tip and the substrate through the electrolyte and causes oxidation or reduction of a particular location on the substrate adjacent to the distal conductive tip.

In one embodiment, causing oxidation or reduction of a particular location on the substrate results in writing a digital one to the particular location on the substrate. Causing the opposite reaction at the particular location on the substrate results in erasing the digital one from the particular location on the substrate.

In another embodiment, causing oxidation or reduction of a particular location on the substrate results in writing a digital zero to the particular location on the substrate. Causing the opposite reaction at the particular location on the substrate results in erasing the digital zero from the particular location on the substrate.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

The invention relates generally to electronic memory, and more particularly to memory systems and methods that involve nanolithography techniques. In one embodiment, the electronic memory of the present invention enables rapid and reliable storage of data on a substrate.

Figure 1:
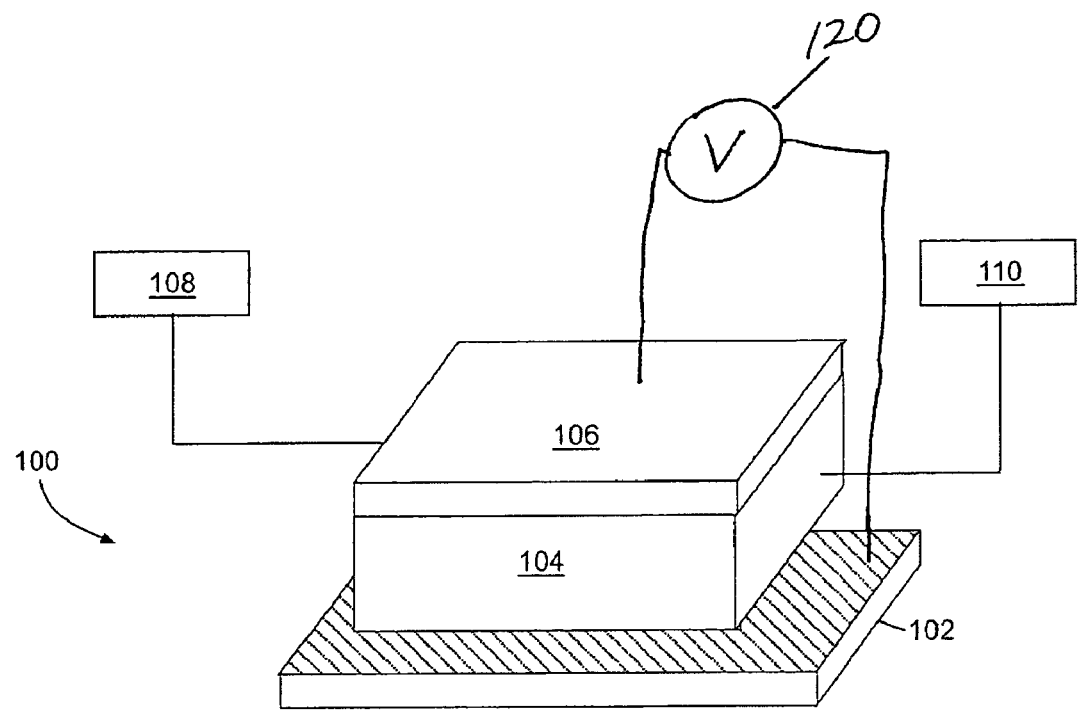
FIG. 1 is an illustrative schematic diagram of memory device, according to one embodiment of the invention.

Referring to FIG. 1, memory device 100 includes a substrate 102 (to be lithographically written to), an electrode device which functions as a memory access head 104 (or array of memory access heads 104), a microchip 106 in communication (such as optical, electrical, or RF, for example) with the memory access head 104 (or array of memory access heads 104), and a voltage supply 120 for supplying voltage between the substrate 102 and microchip 106. In some embodiments, the memory device 100 includes a microchip controller 108 and an X-Y positioning device 110. In other embodiments, other controller sub-systems may be used. Such system include, but are not limited to, wireless transmitter-receiver sub-systems, optical transmitter-receiver sub-systems, pre-programmed or programmable integrated microprocessors within the microchip 106, micro-electro-mechanical, and/or other suitable controller sub-systems integrated in, or associated with, the microchip 106. In still other embodiments, the microchip controller 108 is integral with the microchip 106.

Figure 2:
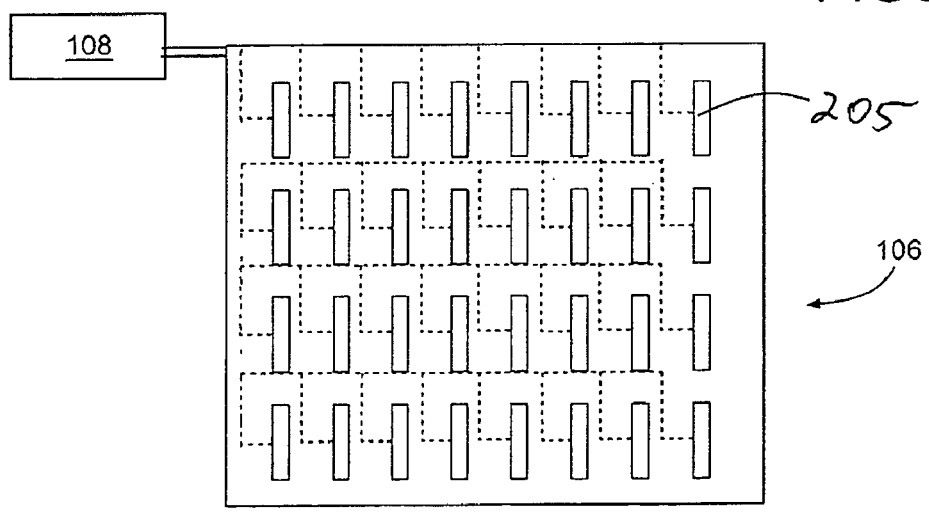
FIG. 2 is an illustrative schematic diagram of a top view of a microchip component of the memory device of FIG. 1.

A top view of the microchip 106 is shown in FIG. 2. The microchip 106 includes one or more switches 205 or other devices for selectively activating associated memory access heads (not shown) by allowing voltage from the voltage supply 120 (FIG. 1) to be applied to the associated memory access heads. In one embodiment, these switches 205 are controlled by the microchip controller 108.

Figures 3A, 3B:
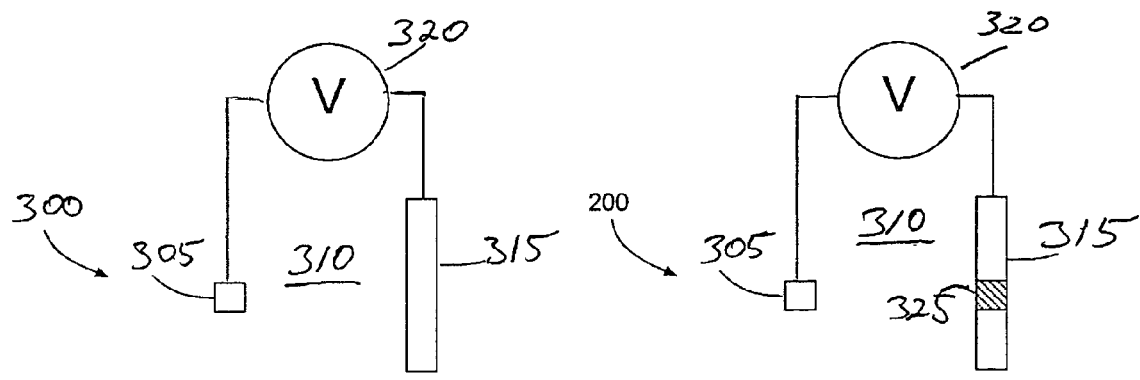
FIG. 3A is an illustrative schematic diagram of an electrochemical lithography system, according to one embodiment of the invention.
FIG. 3B is an illustrative schematic diagram of the electrochemical lithography system of FIG. 3A demonstrating oxidation of an electrode.

FIG. 3A is a diagram of an electrochemical lithography system 300 which is the basis for the electronic memory of the present invention. In general, the lithography system 300 includes electrode 305, electrode 315 and voltage supply 320. The electrodes 305, 315 are separated by an electrolyte 310. The polarity of the electrodes 305, 315 depends on the type of electrochemistry utilized in the lithography system 300. Electrochemical lithography may refer to oxidation or reduction. In operation, when a voltage from voltage supply 320 is supplied across the electrodes 305, 315, a lithography (oxidation or reduction) mark 325 is formed on the electrode 315.

When the lithography system 300 is configured for an oxidation reaction, the electrode 315 operates as a cathode (positive electrode) and the electrode 305 operates as an anode (negative electrode). When a voltage is applied across the electrodes 305, 315, electrons flow from the cathode (electrode 315) to the anode (electrode 305). When the lithography system 300 is configured for a reduction reaction, the electrode 305 operates as a cathode (positive electrode) and the electrode 315 operates as an anode (negative electrode). When a voltage is applied across the electrodes 305, 315, electrons flow from the cathode (electrode 305) to the anode (electrode 315).

Figures 4A, 4B:
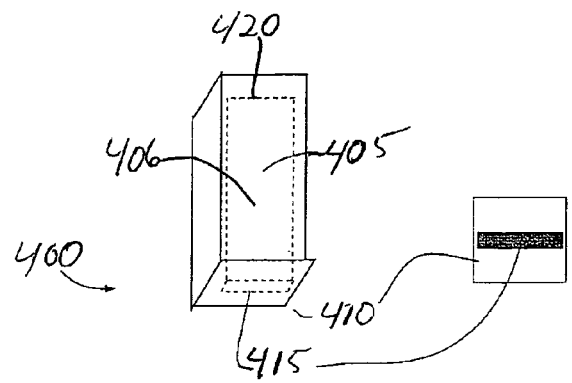
FIG. 4A is an illustrative x-ray perspective diagram of a memory access head, according one embodiment of the invention.
FIG. 4B is an illustrative bottom view of the memory access head of FIG. 4A.

FIGS. 4A and 4B depict one embodiment of a memory access head 400. The memory access head 400 includes a conductive member 405, which includes a body portion 406, a distal conductive tip 415, and a proximal conductive tip 420. The body portion 406 is embedded in an insulative member 410. The distal and proximal conductive tips 415, 420 are contiguous with the body portion 406 and are, in some embodiments, fabricated to be very small, approaching tens of nanometers in cross-sectional area. The conductive member 405 is analogous to the electrode 305 shown in FIGS. 3A and 3B. In one embodiment, the conductive member 405 is an anode when the oxidation configuration is used. In another embodiment, the conductive member 405 is a cathode when the reduction configuration is used.

Figures 5A, 5B:
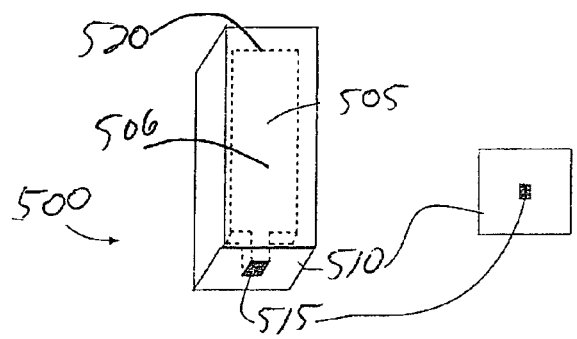
FIG. 5A is an illustrative x-ray perspective diagram of a memory access head, according to still another embodiment of the invention.
FIG. 5B is an illustrative bottom view of the memory access head of FIG. 5A.

FIGS. 5A and 5B depict another embodiment of a memory access head 500. The memory access head 500 includes a conductive member 505, which includes a body portion 506, a distal conductive tip 515, and a proximal conductive tip 520. The body portion 506 is embedded in an insulative member 510. The distal and proximal conductive tips 515, 520 are contiguous with the body portion 506 and are, in some embodiments, fabricated to be very small, approaching tens of nanometers in cross-sectional area. The conductive member 505 is analogous to the electrode 305 shown in FIGS. 3A and 3B. In one embodiment, the conductive member 505 is an anode when the oxidation configuration is used. In another embodiment, the conductive member 505 is a cathode when the reduction configuration is used. This configuration facilitates the formation of smaller oxidation or reduction marks than the configuration shown in FIGS. 4A and 4B.

Figure 6:
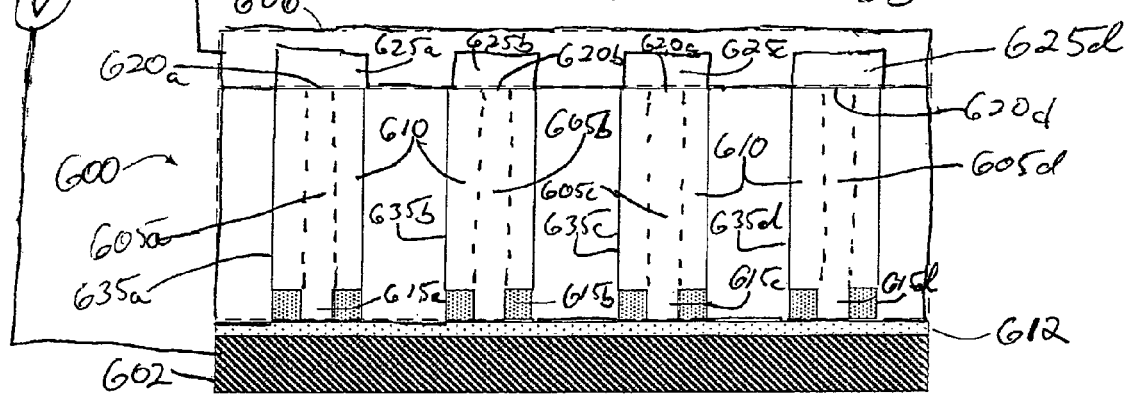
FIG. 6 is an illustrative diagram of an array of memory access heads, according to one embodiment of the invention.

Referring to FIG. 6, in some embodiments, a memory device 600 includes an array of memory access heads 635a-d positioned adjacent to a substrate 602 with an electrolyte 612 disposed between the array of memory access heads 635a-d and the substrate 602. Further, a voltage supply is in communication with the substrate 602 and the microchip 606. As previously described, each of the memory access heads 635a-d includes a conductive member 605a-d, respectively. Further, each conductive member 605a-d is embedded in an insulative member 610a-d, respectively. Each conductive member 605a-d includes a contiguous proximal conductive tip 620a-d and a contiguous distal conductive tip 615a-d. Each of the proximal conductive tips 620a-d is in communication with a switch 625a-d, respectively. Each of the distal conductive tips 615a-d is adjacent to a particular location on the substrate 602. The switches 625a-d are disposed in a microchip 606. A voltage supply 630 is in communication with the microchip 606 and the substrate 602.

Referring to again to FIG. 6 and FIGS. 7 and 8, in operation, in one embodiment, a voltage is applied across the microchip 606 and the substrate 602. The amount of voltage applied is determined by the memory access operation desired. For example, a particular voltage is applied to cause a write operation. An equal, but opposite, voltage is applied to cause an erase operation. A lesser voltage than that used for the write operation is applied for a read operation.

In the oxidation configuration, the substrate 602 is the cathode and the conductive member 605a-d is the anode. Applying a voltage causes the memory access head 635a-d to "write" an oxidation spot at a specific location on the substrate 602. Applying an opposite voltage causes the memory access head 635a-d to reduce or "erase" the previously written oxidation spot. During a "read" operation, a voltage less than that required to cause oxidation is applied. If the spot on the substrate 602 was previously written to or oxidized, there will be a larger current than if the spot on the substrate was not previously oxidized. The value of the read current will indicate the value (1 or 0) stored at the particular location on the substrate 602.

In the reduction configuration, the substrate 602 is the anode and the conductive member 605a-d is the cathode. Applying a voltage causes the memory access head 635a-d to "write" a reduction spot at a specific location on the substrate 602. Applying an opposite voltage causes the memory access head 635a-d to oxidize or "erase" the previously written reduction spot. During a "read" operation, a voltage less than that required to cause reduction is applied. If the spot on the substrate 602 was previously written to or reduced, there will be a larger current than if the spot on the substrate was not previously reduced. The value of the read current will indicate the value (1 or 0) stored at the particular location on the substrate 602.

Figure 7:
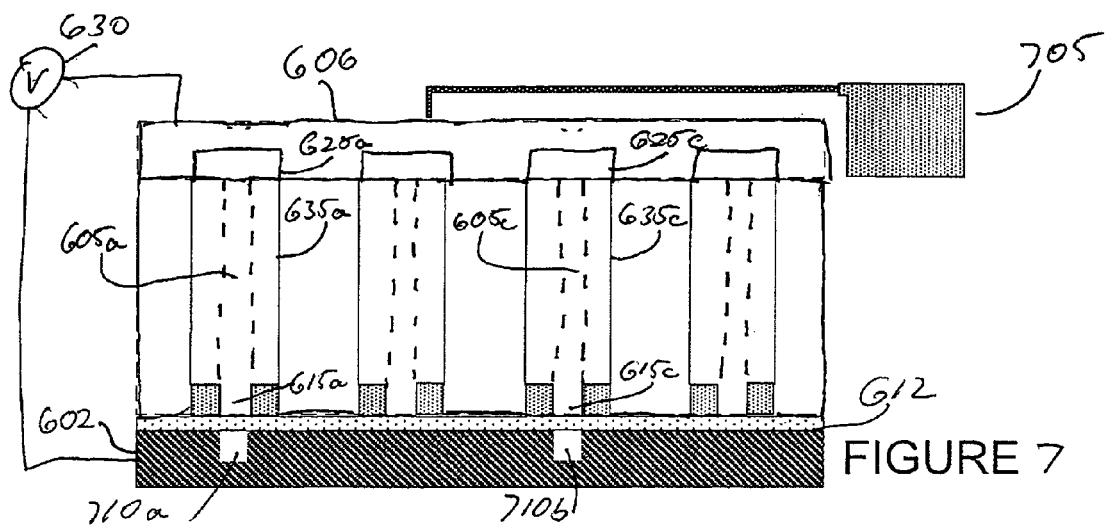
FIG. 7 is an illustrative diagram of the array of memory access heads of FIG. 6 including an X-Y positioning device and data written to a substrate.
Figure 8:
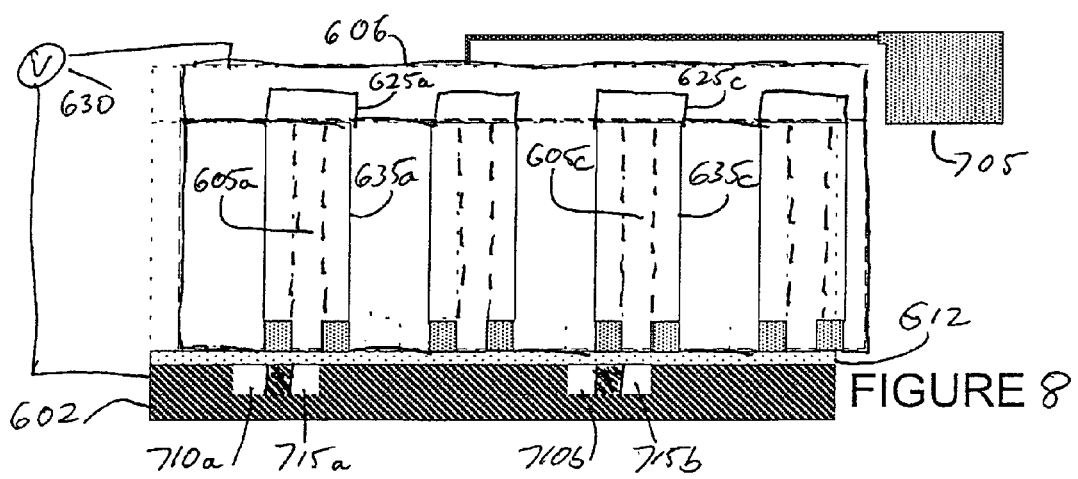
FIG. 8 is an illustrative diagram of the array of memory access heads of FIG. 7 showing data written to another location on the substrate.

Referring still to FIGS. 6, 7 and 8, an X-Y positioning device 705 is used to move the array of memory access heads 635a-d to different locations on the substrate 602 for reading, writing, and erasing operations. Particular memory access heads 635a-d can be selected to read, write, or erase locations on the substrate 602. This can be achieved by computer control of the microchip 606, for example. As previously described, the microchip 606 includes switches 625a-d, which contact the proximal conductive tips 620a-d. The proximal conductive tips 620a-d, in turn contact the conductive members 605a-d, which contact the distal conductive tips 615a-d. The switches 625a-d can be individually selected (via computer control through the microchip 606) to cause the corresponding memory access head 635a-d to read, write, or erase a particular location on the substrate 602. As can be seen in the FIGS. 7 and 8, memory access heads 635a and 635c are directed to write (oxidize or reduce depending on the particular configuration) a digital one (or a zero depending on the logic scheme chosen) at particular locations 710a and 710b on the substrate 602. The X-Y positioning device 705 is then directed (by a computer, for example) to move to a new location and the memory access heads 635a and 635c are again directed (by computer) to write a digital one at particular locations 715a and 715b on the substrate 602.

Figure 9:
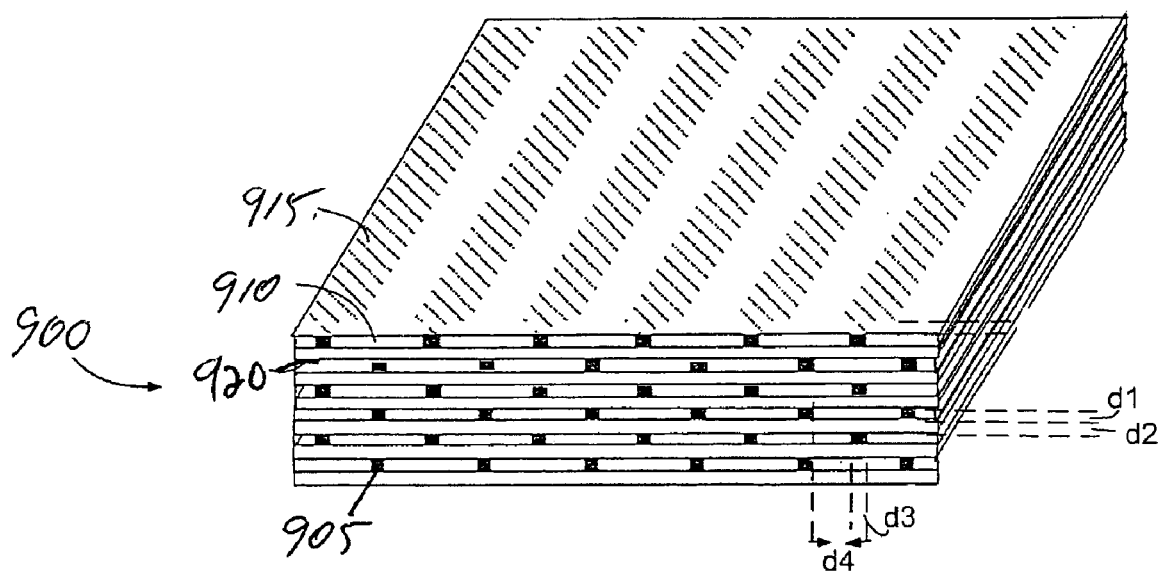
FIG. 9 is an illustrative perspective diagram of an array of memory access heads, according to another embodiment of the invention.

Referring to FIG. 9, in one embodiment, an array of memory access heads 900 is shown. In this configuration, the distal conductive tips (generally 905) are in an alternating pattern. Each distal conductive tip 905 is a monolithic portion of a conductive member 915. The dimensions of the distal conductive tips 905 $d_3$ are less than the dimensions of the conductive member 915 $d_4$. As shown, the width dimension of each conductive member 915 is substantially greater than the width of the distal conductive tips 905. Note that while FIG. 9 depicts the distal conductive tips 905 arranged in a staggered pattern, it will be appreciated by one skilled in the art that the pattern of distal conductive tips 905 may be any desired pattern.

It should be appreciated that a particular pattern of distal conductive tips 905 may be manufactured by varying: the horizontal period of conductive strips 915 and insulative strips 910; the pattern between sequential layers of the distal conducting tips 905; the thickness of different layers; the thickness of different conductive strips 915 and/or insulative strips 910; and/or the thickness of different insulative layers 920.

The conductive members 915 may be formed of any suitable electrically conductive materials including, but not limited to, platinum, palladium, gold, silver, copper, brass, tin, ferrous metals such as stainless steel, nickel, carbon, electrically conducting polymers, electrically conducting ceramics, or combinations and alloys comprising at least one of the foregoing materials. In general, the conductive material should be chosen so that it is electrochemically compatible with a chosen substrate, and stable without generating impurities. In certain embodiments, the material should be oxidizable yet capable of oxidizing other materials.

The insulative members 910 and insulative layers 920 may be formed of the same or different materials, depending on the particular application. Such insulative materials include, but are not limited to, electrically insulating plastics or polymers, ceramics, or glass materials, MgO, ZnO, TiO, other known oxides, nitrides of metals, SiN, or any other suitable insulative material.

Formation of the distal conductive tips 905 may be accomplished my various methods. For example, the distal conductive tips 905 may be formed by electrochemical oxidation. One of skill in the art may appreciate that the distal conductive tips 905 may be polished, depending on the tolerances of the desired system. Known techniques such as grinding, polishing; chemical-mechanical polishing, polish-stop, or combinations of the foregoing techniques may be used.

Figure 10:
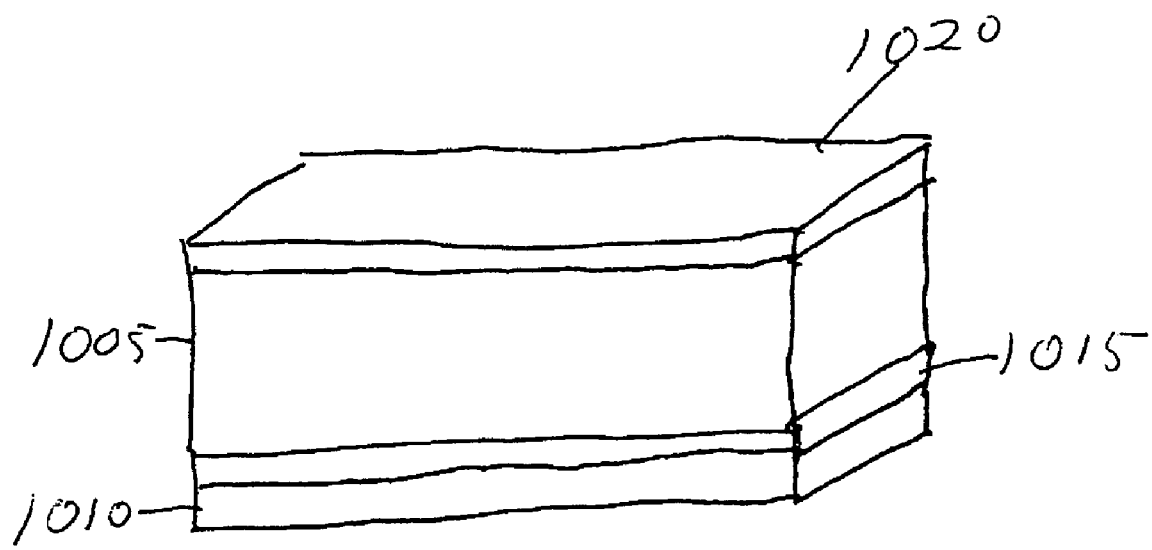
FIG. 10 is an illustrative perspective diagram of a memory device, according to yet another embodiment of the invention.

Referring to FIG. 10, in another embodiment, no X-Y positioning device is used. In this configuration, an array of memory access heads 1005 is disposed in a stationary position on a substrate 1010 with an electrolyte 1015 disposed therebetween. Read, write, and erase functions are accomplished (via control from a microchip 1020) as previously described, except that the array of memory access heads 1005 does not move. Each individual memory access head in the array of memory access heads 1005 only accesses one particular location on the substrate 1010.

In still other embodiments, the invention includes only one memory access head 500 (FIG. 5A) coupled to an X-Y positioning device (such as that shown in FIG. 1). In this embodiment, the X-Y positioning device moves the memory access head 500 to desired locations on a substrate for reading, writing, or erasing, as previously described above.

Figure 11:
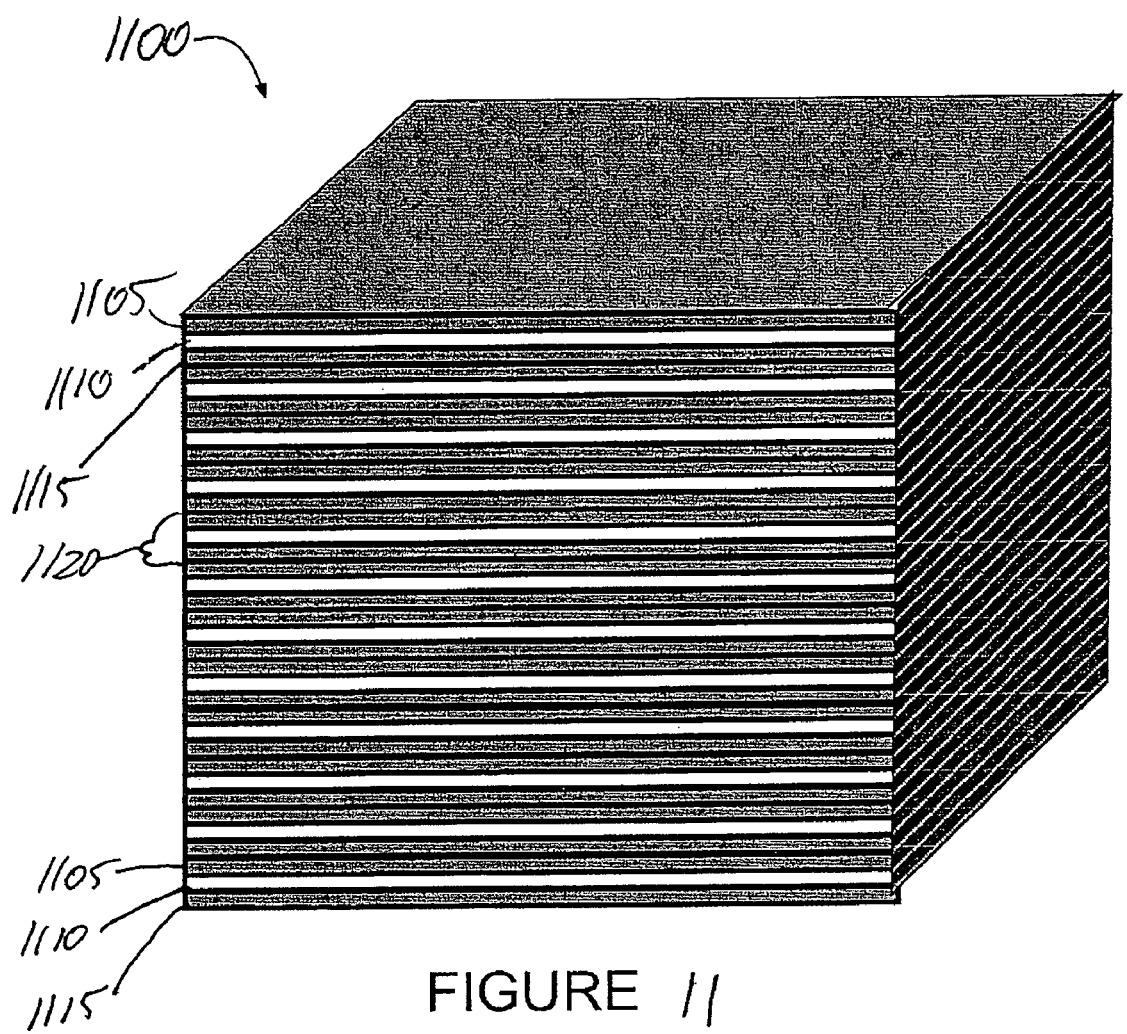
FIG. 11 is an illustrative perspective diagram of a stack of memory devices, according to still another embodiment of the invention.

Referring to FIG. 11, in still another embodiment, a memory system 1100 includes multiple memory devices 1120, each on a separate layer. As previously described, each memory device 1120 includes an array of memory access devices coupled to a microchip (shown together as 1105), an electrolyte 1110, and a substrate 1115. In this embodiment, each memory device 1120 functions as previously described and each memory device 1120 can be accessed and controlled independently and/or simultaneously with other memory devices 1120.

Further details regarding methods of manufacturing the memory devices, reading/writing erasing sub-systems, stack configurations, and other information can be found in parent application U.S. patent application Ser. No. 11/077,542 filed on Mar. 10, 2005 entitled "Nanolithography and Microlithography Devices and Method of Manufacturing Such Devices" which is herein incorporated by reference.

Variations, modifications, and other implementations of what is described herein may occur to those of ordinary skill in the art without departing from the spirit and scope of the invention. Accordingly, the invention is not to be defined only by the preceding illustrative description.

What is claimed is:

1. A memory device comprising:
   a memory access head comprising:
      a conductive member comprising a proximal conductive tip, a distal conductive tip, and a body portion; and
      an insulative member, the body portion being embedded in the insulative member;
   a substrate adjacent to the distal conductive tip;
   an electrolyte disposed between the distal conductive tip and the substrate; and
   a microchip in communication with the proximal conductive tip.

2. The memory device of claim 1 further comprising a voltage source in communication with the substrate and the microchip.

3. The memory device of claim 2 further comprising a voltage controller in communication with the voltage source.

4. The memory device claim 1 further comprising a voltage-measuring device in communication with the substrate and the proximal conductive tip.

5. The memory device of claim 1 wherein the conductive member comprises an anode and the substrate comprises a cathode.

6. The memory device of claim 1 wherein the conductive member comprises a cathode and the substrate comprises an anode.

7. The memory device of claim 1 further comprising a position controller in communication with the memory access head.

8. The memory device of claim 1 wherein the microchip comprises at least one switch in communication with the proximal conductive tip.

9. The memory device of claim 1 wherein the microchip comprises a plurality of switches, each of the plurality of switches being in communication with one of the proximal conductive tips.

10. A memory device comprising:
    an array of memory access heads, each memory access head comprising:
       a conductive member comprising a proximal conductive tip, a distal conductive tip, and a body portion; and
       an insulative member, the body portion being embedded in the insulative member;
    a substrate adjacent to each of the distal conductive tips in the array of memory access heads;
    an electrolyte disposed between the array of memory access head and the substrate; and
    a microchip in communication with each of the proximal conductive tips in the array of memory access heads.

11. The memory device of claim 10 further comprising a voltage source in communication with the substrate and the microchip.

12. The memory device of claim 11 further comprising a voltage controller in communication with the voltage source.

13. The memory device claim 10 further comprising a voltage-measuring device in communication with the substrate and each of the proximal conductive tips in the array of memory access heads.

14. The memory device of claim 10 wherein each of the conductive members comprises an anode and the substrate comprises a cathode.

15. The memory device of claim 10 wherein each of the conductive members comprises a cathode and the substrate comprises an anode.

16. A method of writing data to a memory, comprising:
    providing a memory device comprising:
       a memory access head comprising:
          a conductive member comprising a proximal conductive tip, a distal conductive tip, and a body portion; and
          an insulative member, the body portion being embedded in the insulative member;
       a substrate adjacent to the distal conductive tip; and
       an electrolyte disposed between the distal conductive tip and the substrate; and
    applying a voltage to the substrate and the proximal conductive tip thereby causing ionic transfer between the distal conductive tip and the substrate through the electrolyte and causing one of oxidation and reduction of a particular location on the substrate adjacent to the distal conductive tip.

17. The method of claim 16 wherein causing one of oxidation and reduction of a particular location on the substrate results in writing a digital one to the particular location on the substrate and the other one of oxidation and reduction of the particular location on the substrate results in erasing the digital one from the particular location on the substrate.

18. The method of claim 16 wherein causing one of oxidation and reduction of a particular location on the substrate results in writing a digital zero to the particular location on the substrate and the other one of oxidation and reduction of the particular location on the substrate results in erasing the digital zero from the particular location on the substrate.

* * * * *